United States Patent
Wang

Patent Number: 5,728,631
Date of Patent: Mar. 17, 1998

[54] METHOD FOR FORMING A LOW CAPACITANCE DIELECTRIC LAYER

[75] Inventor: Chin-Kun Wang, Taipei, Taiwan

[73] Assignee: Taiwan Semiconductor Manufacturing Company, Ltd., Hsin-Chu, Taiwan

[21] Appl. No.: 537,106

[22] Filed: Sep. 29, 1995

[51] Int. Cl.$^6$ .................................. H01L 21/31
[52] U.S. Cl. ................ 438/787; 438/788; 438/698; 438/422
[58] Field of Search ................... 438/421, 422, 438/694, 696, 698, 697, 787, 788, 438

[56] References Cited

U.S. PATENT DOCUMENTS

| | | | |
|---|---|---|---|
| 4,492,620 | 1/1985 | Matsuo et al. | 204/192 |
| 4,778,620 | 10/1988 | Goto et al. | 252/299.63 |
| 4,962,063 | 10/1990 | Maydan et al. | 437/228 |
| 5,017,509 | 5/1991 | Tuckerman | 437/195 |
| 5,124,014 | 6/1992 | Foo et al. | 437/238 |
| 5,192,715 | 3/1993 | Shiwa, Jr. et al. | 437/195 |
| 5,310,700 | 5/1994 | Lien et al. | 437/195 |
| 5,324,683 | 6/1994 | Fitch et al. | 148/DIG. 73 |
| 5,407,860 | 4/1995 | Stoltz et al. | 437/228 H |
| 5,506,173 | 4/1996 | Nishimoto | 437/195 |
| 5,510,293 | 4/1996 | Numata | 437/190 |
| 5,516,720 | 5/1996 | Lur et al. | 148/DIG. 73 |

FOREIGN PATENT DOCUMENTS

| | | | |
|---|---|---|---|
| 0098134 | 4/1988 | Japan | 437/195 |
| 0318752 | 12/1988 | Japan | 437/195 |
| 0151032 | 6/1990 | Japan | 437/195 |

OTHER PUBLICATIONS

"Improved Sub–Micron Inter–Metal Dielectric Gap–Filing Using Teos/ozone APCVD" by E.J. Korczyski et al, pub in Microelectronics Tech. Jan. 1992, pp. 22–27.

*Primary Examiner*—Tuan H. Nguyen
*Attorney, Agent, or Firm*—George O. Saile; Stephen B. Ackerman; William J. Stoffel

[57] ABSTRACT

An improved structure and a process for forming an inter-level dielectric layer having a low capacitance between closely spaced metallurgy lines is provided. The method begins with a substrate surface having closely spaced metallurgy lines. A silicon oxide dielectric layer having a closed void between adjacent metallurgy lines is formed using electro cyclotron resonance techniques. The voids in the silicon dioxide dielectric layer are formed by controlling the ECR process parameters to achieve a proper etch to deposition ratio. The etch to deposition ratio of the silicon oxide layer is adjusted to the particular height and spacing between the metallurgy lines. Next, a spin-on-glass layer is formed over the silicon oxide dielectric layer. Portions of the SOG layer are etched back or chemically mechanically polished. The void (air) has a lower capacitance than the ECR silicon oxide layer. Therefore, the void in the silicon oxide dielectric layer reduces the capacitance of the layer, and in particular reduces the capacitance between metallurgy lines in the same level, which increases device performance.

14 Claims, 4 Drawing Sheets

METHOD FOR FORMING A LOW CAPACITANCE DIELECTRIC LAYER

BACKGROUND OF THE INVENTION

1) Field of the Invention

This invention relates to a planarization process for semiconductor integrated circuit structures. More particularly, this invention relates to an inter-metal-dielectric planarization process that provides a low capacitance between adjacent metallurgy lines.

2) Description of the Prior Art

As device geometry and operating voltages continue to scale down and functional density increase, it is important to reduce RC (resistance/capacitance) delay and maintain adequate crosstalk signal-to-noise margins. To provide immediate performance though the reduction in capacitance, especially lateral line capacitance, is a particularly effective solution.

In conventional processes, the space between conductive lines is filled with a solid dielectric layer. The dielectric layer can be formed of many materials including, silicon oxide, silicon nitride, boron doped silicon oxide, phosphorus doped silicon oxide, spin-on-glass, etc. These layers can be formed by many different processes, such as silicon oxide which can be formed of conventional thermal processes, chemical vapor deposition processes and electro cyclotron resonance processes. While effective, these layers have capacitance which contribute to device delay. Moreover, many dielectric layers, such as spin-on-glass and silicon oxide, absorb moisture which increases their capacitance.

Therefore, there is a need for an improved structure and process for forming a dielectric layer between closely spaced metallurgy lines that reduces capacitance. This process must be easy to manufacture and not impact the reliability of the semiconductor devices.

Matsuo et al, U.S. Pat. No. 4,962,063, Goto U.S. Pat. No. 4,778,620, and Maydan, U.S. Pat. No. 4,962,063 show methods and equipment for ECR deposition of dielectric layers. The article "Improved Sub-micron Inter-metal Dielectric Gap-filling Using TEOS/OZONE APCVD" by E. J. Korezyski et al, published in the Microelectronics, January 1992 pp. 22–27 provides a comparison of ECR and TEOS/O3 planarization methods.

Maydan et at., U.S. Pat. No. 4,962,063, teaches a planarization process which comprises depositing a conformal insulation layer by ECR plasma deposition of an insulation material. The ECR plasma deposition is carried out until the trenches between adjacent raised portions are completely filled with insulation material. A planarization layer of low melting glass material is flow deposited over the ECR. The planarization layer is etched back to produce a planarized surface of the ECR insulation layer and the planarization layer. A second insulation layer may be formed over the ECR insulation layer to encapsulate any remaining portions of the planarization layer. However, this process can be improved by providing a lower capacitance insulation layer.

What is needed is an approach to planarization of topographies encountered in semiconductor processing that provides a lower capacitance insulation layer and that provides a more planar surface.

SUMMARY OF THE INVENTION

It is an object of this invention to furnish a process for planarizing an integrated circuit structure that provides a lower capacitance dielectric layer and improved planarization uniformity without increasing costs and manufacturing complexity.

It is yet another object of the present invention to provide a process to planarize topographies which reduces interlayer capacitance between adjacent metallurgy lines.

According to the present invention a process for forming an interlevel dielectric layer between closely spaced metallurgy lines having a low capacitance is provided as follows. A substrate surface having closely spaced metallurgy lines is provided. A silicon oxide dielectric layer having a closed void (e.g., a completely closed cavity) between adjacent structures is formed using electro cyclotron resonance (ECR) techniques.

The voids in the silicon dioxide dielectric layer are formed by controlling the ECR technique. To form the voids with the electro cyclotron resonance technique, the etch to deposition ratio of the silicon oxide layer is adjusted to the particular spacing between the metallurgy lines. For example, with the spacing between the adjacent metallurgy lines about 0.4 µm, the ECR technique has an etch to deposit ratio of about 30%. To achieve the 30% etch to deposition ratio the ECR technique has a RF power of about 1200 watts and an Argon flow rate of about 90 sccm.

Next, a spin-on-glass layer is formed over the silicon oxide dielectric layer. The spin-on-glass (SOG) layer is then planarized by an etch back process or by a chemical mechanical polishing (CMP) process.

The void in the silicon oxide dielectric layer reduces the capacitance of the layer, and in particular reduces the capacitance between metallurgy lines in the same level, which increases device performance. The void reduces the overall device capacitance because the dielectric constant (k) of the void (k of air is approximately 1) is much lower than the dielectric constant (k) of traditional PECVD oxide (k of an oxide is approximately 3.8). Capacitance is defined by: C=k (area)/distance therefore as k decreases, the capacitance decreases. It is estimated that the void of the present invention should typically lower the overall capacitance of the layer by approximately 25%.

These and other objects of the invention will be come apparent from the following description and accompanying drawings.

DETAILED DESCRIPTION OF THE PREFERRED EMBODIMENTS

The present invention will be described in detail with reference to the accompanying drawings. It should be noted that the drawings are in greatly simplified form. In accordance with the above objectives, a process for the planarization of an integrated circuit structure and formation of a low capacitance inter level dielectric layer between closely spaced metallurgy lines is provided. The integrated circuit structure or substrate 10 has active and passive devices formed therein and thereon (not shown). The substrate can include metallurgy lines and insulating layers formed on the substrate surface. The substrate 10 is a semiconductor substrate as well known in the art.

Figure 1:
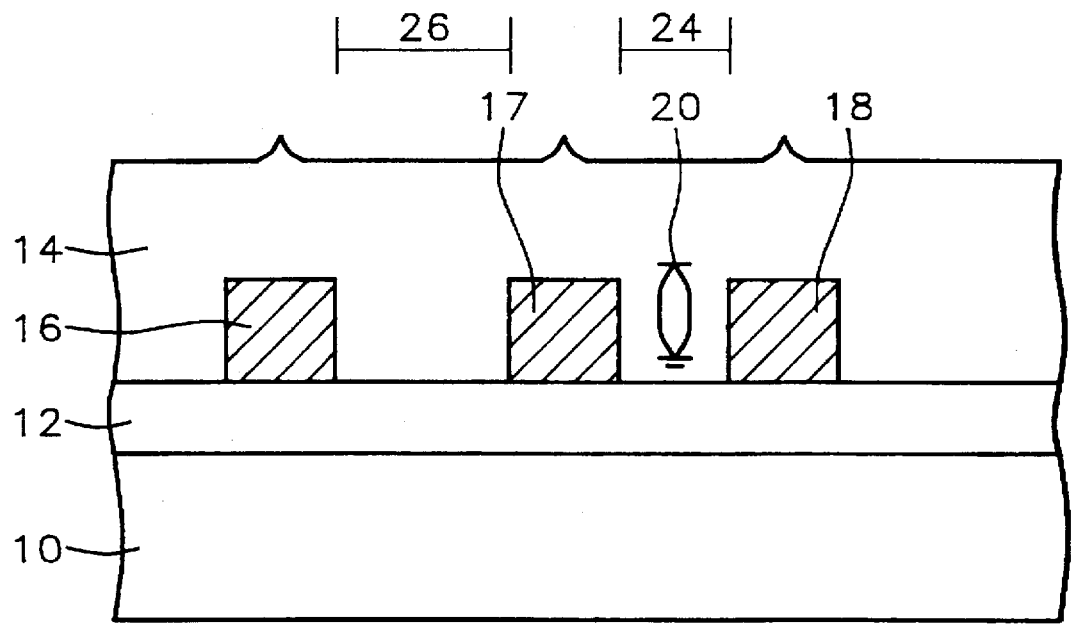
FIG. 1 is a schematic sectional view for explaining the process of the present invention for providing a low capacitance planarizing dielectric layer over closely spaced metallurgy lines having different spacings.

As shown in FIG. 1, an insulating layer 12 is formed on the substrate surface. The insulating layer 12 can be formed of silicon oxide, borophosphosilicate glass (e.g., formed by a silane process) and a boron doped silicon oxide formed by a tetraethoxysiliane (TEOS) technique (BPTEOS). The insulating layer 12 is preferably formed of boron doped silicon oxide formed by a TEOS technique. The insulating layer 12 can have a thickness in the range between about 6000 to 10,000 Å and more preferably about 8000 Å.

Next, closely spaced metallurgy lines 16 17 18 are formed on the substrate surface of the integrated circuit structures. The metallurgy lines 16 17 18 have top surfaces. The metallurgy lines 16 can be formed of tungsten interconnect, AlSiCu and AlCu and are preferably formed of AlSiCu. Adjacent metallurgy lines can have a spacing in the range between about 0.25 μm to 0.5 μm and more preferably about 0.35 μm. FIG. 1 shows two different spacings 24 26 between the lines. The spacing 24 between lines 17 and 18 is smaller than the spacing between lines 16 and 17. For example, the spacing 24 could be 0.4 μm and the spacing 26 could be 0.5 μm. For particular ECR deposition parameters, the different spacings 24 26 cause a void not to be formed or to be formed at different vertical levels in the oxide layer. See FIG. 1.

The narrowly spaced metallurgy lines can have a width in the range between about 0.25 to 0.5 μm and more preferably about 0.35 um. The metallurgy lines 16 can have a vertical height in the range between about 0.4 to 0.6 μm and more preferably about 0.5 μm.

Subsequently, a silicon oxide dielectric layer 14 having a closed void 20 between adjacent metallurgy lines 17 18 is formed using electro cyclotron resonance (ECR) techniques. The voids are preferably formed between the closely spaced metallurgy lines such that over half of the void volume is below the horizontal plane formed by the top surface of the metal lines and above the surface of the substrate. The voids 20 in the silicon dioxide dielectric layer 14 are formed by controlling the ECK technique parameters, such as the argon flow and the rf power. To form the voids between lines with a specific spacing with the electro cyclotron resonance technique, the etch to deposition ratio (E/D ratio) of the silicon oxide layer is adjusted to the particular height and spacing between the metallurgy lines. The etch to deposition ratio is largely controlled by the rf power and argon flow rate.

The dielectric layer 14 can be formed of silicon oxide, doped silicon oxide, silicon nitride or silicon oxynitride. The dielectric layer is preferably formed of silicon dioxide. An insulating layer composed of silicon oxide can be formed using electron cyclotron resonance (ECR) plasma deposition as described in U.S. Pat. No. 4,962,063, Maydan et al to which cross reference is hereby made. For example to form a $SiO_2$ insulating layer, oxygen should be fed into the plasma formation chamber at a rate of from about 15 standard cubic centimeters per minute (sccm) to about 300 sccm; and silane into the deposition chamber, at a rate of from about 15 sccm to about 300 sccm; and argon at a rate between about 30 to 120 sccm and more preferably about 90 sccm; while maintaining the temperature in the deposition chamber at from about 25° C. to about 400° C.; and a pressure ranging from about 0.005 to about 200 Millitorr. The magnetic flux density of the magnet used to provide the electron cyclotron resonance in the plasma formation chamber should range from about 500 to 2500 gauss while the microwave frequency used to form the plasma should range from about 1 to about 4 gHz. A plasma power level of from about 100 to about 1500 Watts should be used. For example, when the magnetic flux density is 875 gauss, the microwave frequency should be about 2.45 gHz. The ECK plasma deposition parameter are preferably adjusted to provide an aspect ratio (depth to width) of at least 1 and preferably as high as 3.

The preferred ECR oxide deposition process to form voids in dielectric layer 14 with a line spacing between 0.25 to 0.035 μm and preferably about 0.3 μm and a line width in the range between about 0.4 to 0.6 μm and more preferably about 0.5 μm; has an argon flow rate in the range between about 80 to 120 sccm and more preferably about 100 sccm; and a silane flow in the range between about 68 to 88 sccm and more preferably about 78 sccm; and an oxygen flow in the range between about 115 to 135 sccm and more preferably about 125 sccm; and a magnetic flux density in the range between about 850 to 900 gauss and more preferably about 875 gauss; and a rf frequency in the range between about 13.46 to 13.66 MHz and more preferably about 13.56 MHz; and a rf power in the range between about 1000 to 1600 watts and more preferably about 1200 watts; and a deposition pressure in the range between about 4 to 6 torr and more preferably about 5 torr; and a deposition temperature in the range between about 275° to 325° C. and more preferably about 300° C.; and deposition time in the range between about 3 to 5 minutes and more preferably about 4 minutes; and an aspect ratio in the range between about 1.5 to 1.9 and more preferably about 1.7.

The dielectric layer 14 composed of silicon oxide using ECR plasma deposition can have a thickness in the range of about 8000 to 30,000 Å and more preferably a thickness in the range of about 10,000 to 15,000 Å.

Figure 3:
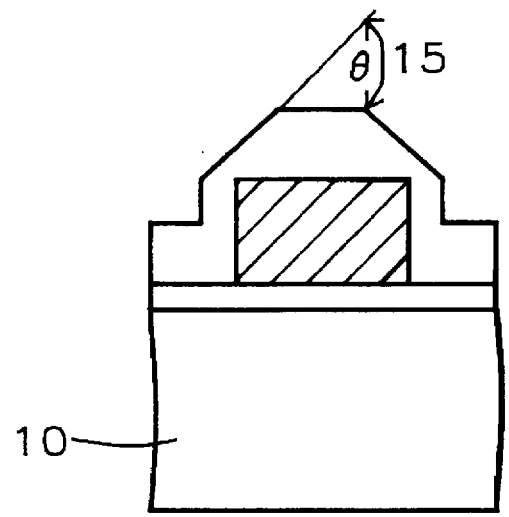
FIG. 3 is a cross sectional view of the dielectric layer of the present invention for illustrating the effects of the etch to deposit ratio of the ECR process.
Figure 4:
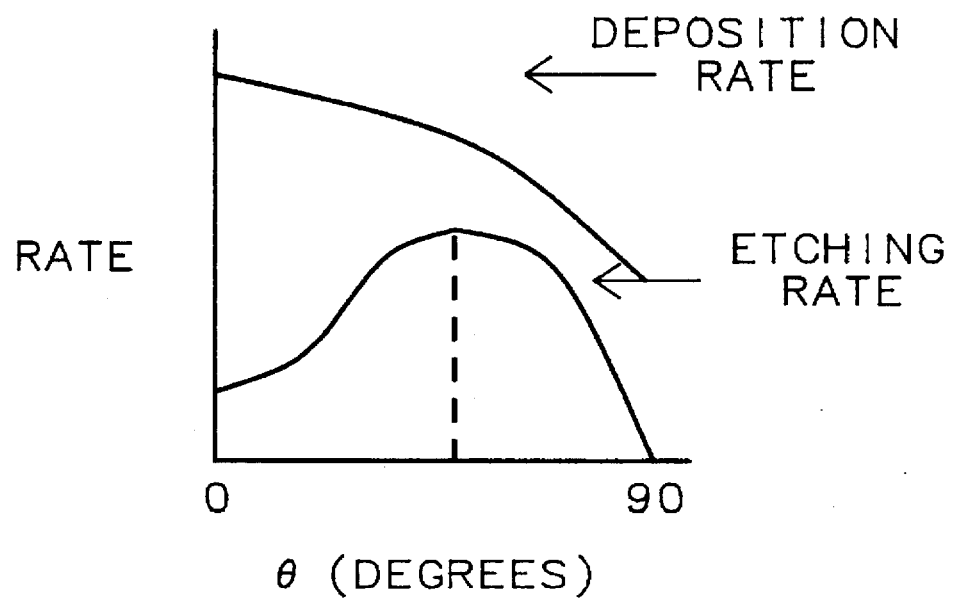
FIG. 4 is a graph showing the relationship between the etch and deposition rates as a function of angle Ø from the deposition/etch surface.

The ECR deposition process can be controlled by adjusting the rf power and the argon flow rate to form voids between the metallurgy lines. The argon gas in the reactor etches the dielectric layer 14. FIG. 4 shows the deposition and etch rates as a function of the angle Ø (15) as shown in FIG. 3. Both the etch and deposition rate are a function of the angle Ø of the surface. The etch rate peaks at about 45° while the deposition rate gets lowers as angle Ø increases. The etch to deposition rate is given by the following equation:

$$\text{Etch to Deposition ratio} = \frac{R(rf=0) - R(rf,\emptyset)}{R(rf=0)}$$

Where:

R(rf=0)=deposition rate at radio frequency bias equals zero

R(rf, O)=deposition rate at the radio frequency bias and deposition angle Ø.

To form properly voids, as the line spacing decreases, the process parameters must be set so that the E/D ratio increases to properly form the voids.

Figure 5:
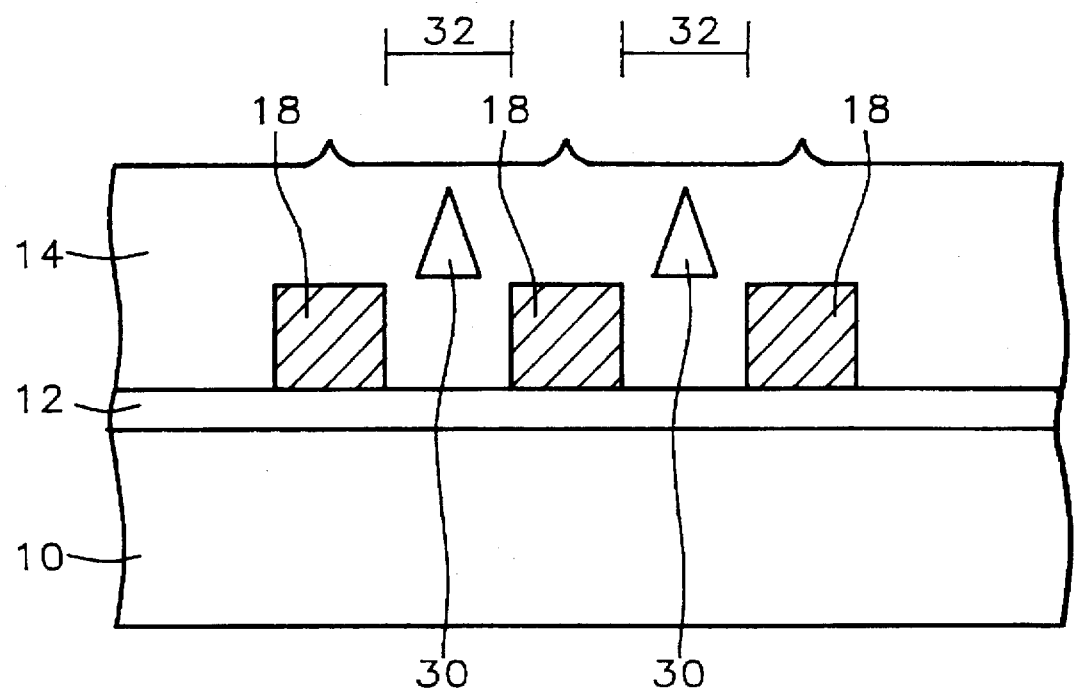
FIG. 5 is a schematic cross sectional view for explaining the process of the present invention for providing a low capacitance planarizing insulating layer over closely spaced metallurgy lines where the ECR process was not adjusted properly and the voids were formed improperly above the horizontal plane defined by the top surface of the of metallurgy lines.
Figure 6:
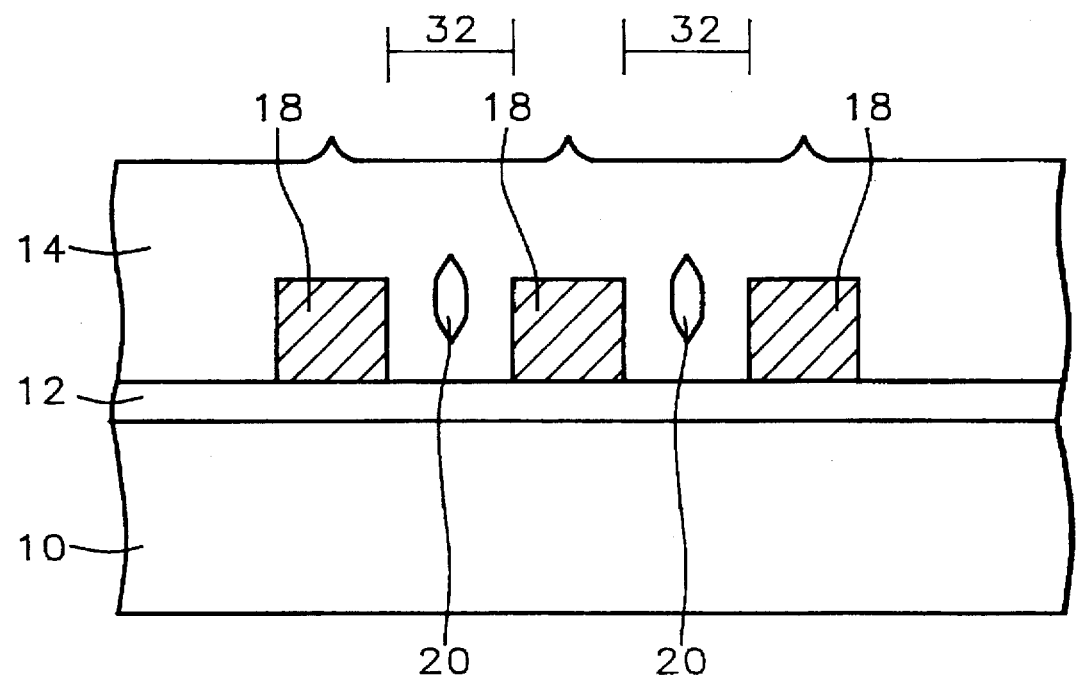
FIG. 6 is a schematic cross sectional view for explaining the process of the present invention for providing a low capacitance planarizing insulating layer over closely spaced metallurgy lines where the voids are formed properly between the lines.
Figure 7:
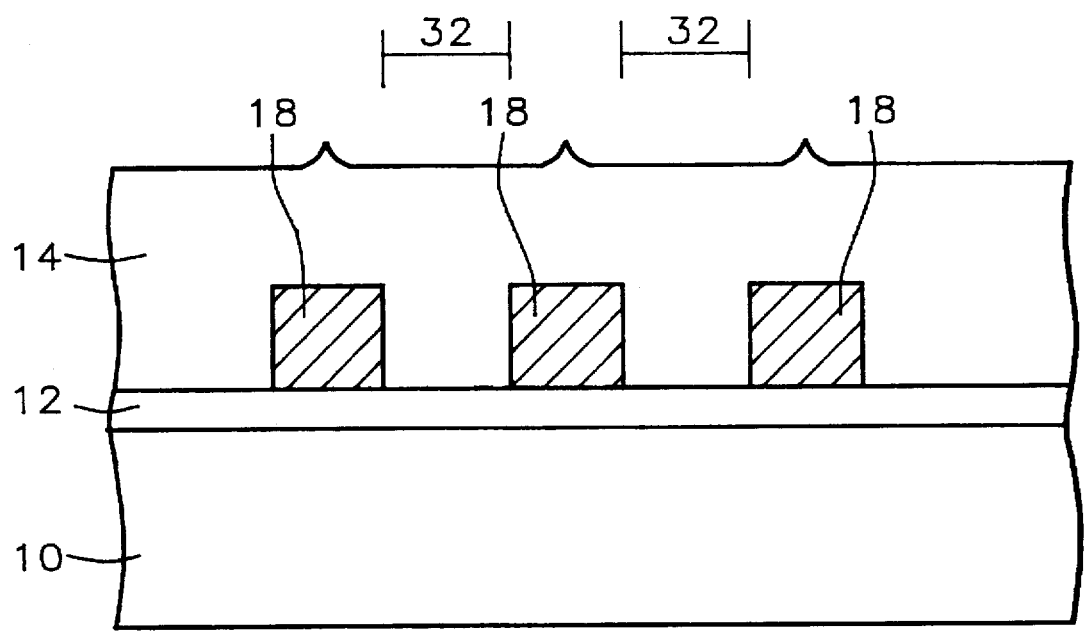
FIG. 7 is a schematic cross sectional view for explaining the process of the present invention for providing a low capacitance planarizing insulating layer over closely spaced metallurgy lines where the ECR process was not adjusted properly and no voids were formed.

FIGS. 5, 6, and 7 show effects of three different etch to deposition (E/D) ratios on void 20 for a fixed line spacing 32 of 0.4 µm. FIG. 5 shows an ECR silicon dioxide layer 14 formed by improperly set ECR process parameters where the voids are formed above the metal lines 18, not between the metal lines. The voids 30 are formed above the metal lines and therefore are not as effective in reducing the capacitance of the dielectric layer 14. FIG. 5 represents an ECR technique with an etch to deposition ratio (E/D ratio) of about 23%. This E/D ratio is too low to form the voids lower in the layer 14.

FIG. 6 shows the voids properly located between the lines 18. FIG. 6 represents an ECR technique with an etch to deposition ratio (E/D ratio) of about 30%.

FIG. 7 shows ECR dielectric layer 14 without voids. FIG. 7 represents an ECR technique with an etch to deposition ratio (E/D ratio) of about 35%.

The voids 20 can have a width in the range between about 0.1 to 0.2 µm and more preferably about 0.15 µm. The voids 20 can have a length in the range between about 0.1 to 0.3 µm and more preferably about 0.2 µm and a height between about 0.1 to 0.6 µm.

For a spacing 32 between the adjacent metallurgy lines in the range between about 0.25 to 0.35 µm and more preferably about 0.3 µm, the ECR technique has an etch to deposit ratio in the range between about 35 to 45% and the ECR technique has an RF power in the range between about 1200 to 1600 watts and an Argon flow rate in the range between about 100 to 120 sccm.

For a spacing 32 between the adjacent metallurgy lines in the range between about 0.35 to 0.45 µm and more preferably about 0.4 µm, the ECR technique has an etch to deposit ratio in the range between about 30 to 35% and the ECR technique has an RF power in the range between about 1200 to 1600 watts and an Argon flow rate in the range between about 80 to 100 sccm.

For a spacing 32 between the adjacent metallurgy lines in the range between about 0.45 to 0.55 and more preferably about 0.5 µm, the ECK technique has an etch to deposit ratio in the range between about 27 to 30% and the ECR technique has an RF power in the range between about 1200 to 1600 and an Argon flow rate in the range between about 70 to 90 sccm.

FIG. 1 shows an ECR silicon oxide dielectric layer 14 over two differently spaced lines. FIG. 1 shows that where the ECR technique is adjusted properly to form voids between one given spacing 24 (e.g., 0.4 µm), a larger spacing (e.g., 0.5 µm) will not from voids. For example, this figure represents a void spacing 24 of about 0.4 µm and large void spacing 26 is about 0.5 µm.

Figure 2:
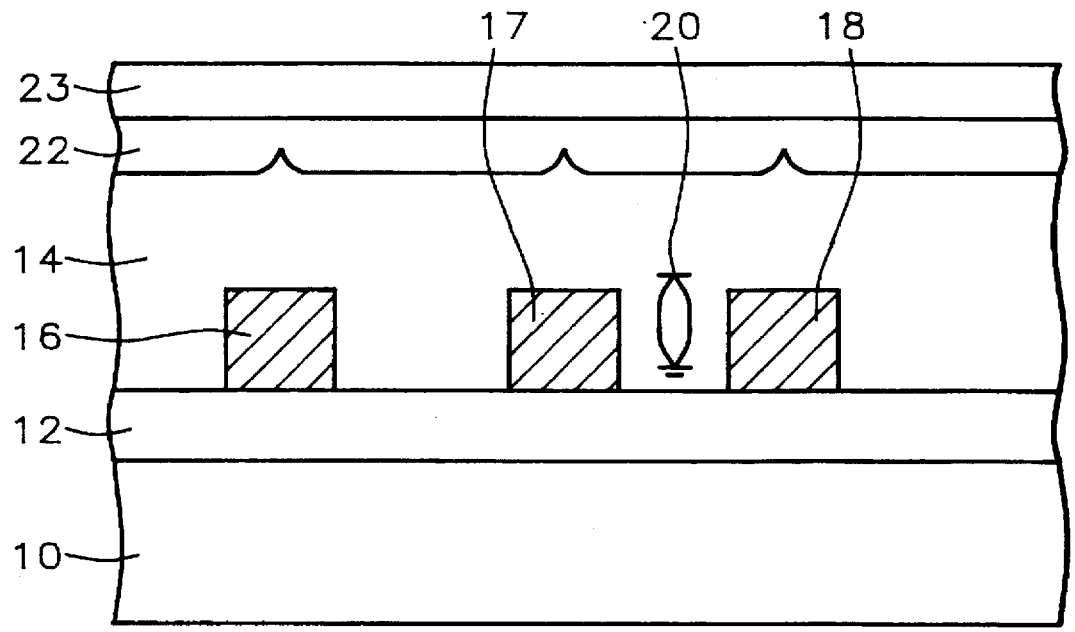
FIG. 2 is a schematic sectional view for explaining the process of the present invention for providing a low capacitance planarizing dielectric layer over closely spaced metallurgy lines and planarization layers over the dielectric layer.

As shown in FIG. 2, the process continues by planarizing the dielectric layer 14 and adding additional insulating layer(s). Preferably, a spin-on-glass (SOG) layer 22 is formed over the silicon oxide dielectric layer 14. The SOG layer can have a thickness in the range between about 4000 to 8000 and more preferably about 6000 Å. The spin-on-glass layer 22 is preferably partially etched back. The SOG layer 22 can be etched back to a thickness in the range between about 4000 to 8000 Å and more preferably to about 6000 Å. Alternately, the ECR oxide layer 14 can be planarized by a conventional chemical mechanical polish process (CMP).

The process of the present invention can be repeated on subsequent metallurgy layers. Also, the process of the invention can be performed on the first level metallurgy layers, such as gate electrodes.

The low capacitance dielectric layer of the present invention has the significant advantage of reducing the capacitance between adjacent closely spaced lines (e.g., lateral coupling capacitance). Compared to a conventional TEOS dielectric layer, it is estimated that the capacitance can be reduced as much as by approximately 25% for a frequency of 100 khz and Voltage of 5 V. The void reduces the overall device capacitance because the dielectric constant (k) of the void (k of air is approximately 1.0) is much lower than the dielectric constant (k) of traditional PECVD oxide (k PECVD oxide is approximately 3.8). Capacitance=k(Area)/(distance), therefore as k decreases the capacitance proportionally decreases.

The process of the invention is easy to perform and cost efficient. Moreover, the voids do not reduce product yields because the voids are not exposed in subsequent processing and will not effect device reliability. Moreover, the process of the invention can be applied to many other high density plasma ECR CVD layers by controlling the etch to deposition ratio to properly form voids between devices that have capacitance effects.

While the invention has been particularly shown and described with reference to the preferred embodiments thereof, it will be understood by those skilled in the art that various changes in form and details may be made without departing from the spirit and scope of the invention.

What is claimed is:

1. A method of forming voids in a low capacitance dielectric layer between narrowly spaced metallurgy lines on a substrate using an ECR oxide deposition process comprising:

forming narrowly spaced conductive metallurgy lines having top surfaces on a substrate surface; said spaced metallurgy lines having a spacing between adjacent lines between about 0.25 and 0.35 µm;

forming a silicon oxide dielectric layer having a closed void between adjacent metallurgy lines using electro cyclotron resonance techniques; said ECR technique has an etch to deposit ratio in the range between about 35 to 40% and said ECR technique has an RF power in the range between about 1200 to 1600 watts and an Argon flow rate in the range between about 100 to 120 sccm, said closed void having width in the range between about 0.1 to 0.2 µm and a height between about 0.1 to 0.6 µm and a length between about 0.1 and 0.3 µm;

forming a SOG layer over said silicon oxide dielectric layer; and etching back portions of said SOG layer.

2. The method of claim 1 wherein said silicon oxide dielectric layer is formed by an electron cyclotron resonance plasma deposition having a thickness in the range of about 8000 to 30,000 Å.

3. The method of claim 2 wherein said narrowly spaced metallurgy lines have a width in the range between about 0.25 to 0.5 µm and a height in the range between about 0.4 to 0.6 µm.

4. A method of forming voids in a low capacitance dielectric layer between narrowly spaced metallurgy lines on a substrate using an enhanced cyclotron resonance silicon oxide deposition process comprising:

forming narrowly spaced conductive metallurgy lines having top surfaces on a substrate surface, the spacing between said spaced metallurgy lines is in a range between about 0.25 and 0.35 µm, said narrowly spaced metallurgy lines have a width in a range between about 0.25 and 0.5 µm and a height in a range between about 0.4 and 0.6 µm;

forming a dielectric layer having one closed void between said spaced metallurgy lines using an electro cyclotron resonance technique, and said electro cyclotron resonance technique has an etch to deposit ratio in a range between about 35 and 40% and the electro cyclotron resonance technique has an RF power in a range between about 1200 and 1600 watts and an Argon flow rate in a range between about 80 and 120 sccm and a silane flow in a range between about 68 and 88 sccm and an oxygen flow in a range between about 115 and 135 sccm, and a magnetic flux density in a range between about 850 and 900 gauss and a rf frequency in a range between about 13.46 and 13.66 MHz and a rf power in a range between about 1000 and 1600 watts, and a deposition pressure in a range between about 4 and 6 torr and a deposition temperature in a range between about 275° and 325° C. and deposition time in a range between about 3 and 5 minutes and an aspect ratio in a range between about 1.5 and 1.9, said closed void has a width in a range between about 0.1 and 0.2 µm and a length in a range between about 0.1 and 0.3 µm and a height from about 0.1 and 0.6 µm, whereby greater than one half of the volume of said void is located below the plane defined by said top surfaces of said metallurgy lines and above the substrate surface, said dielectric layer is formed of silicon dioxide having a thickness in a range of about 10,000 and 15,000 Å.

5. The method of claim 4 wherein the method further includes forming a SOG layer over said dielectric layer and etching back portions of said SOG layer.

6. The method of claim 4 which further includes planarizing said dielectric layer using a chemical mechanical polishing process.

7. A method of forming voids in a low capacitance dielectric layer between narrowly spaced metallurgy lines on a substrate using an enhanced cyclotron resonance deposition process comprising:

forming narrowly spaced conductive metallurgy lines having top surfaces on a substrate surface, the spacing between said adjacent metallurgy lines is in a range between about 0.35 and 0.45 µm, said narrowly spaced metallurgy lines have a width in a range between about 0.25 and 0.5 µm and a height in a range between about 0.4 and 0.6 µm, forming a dielectric layer having one closed void between adjacent metallurgy lines using an electro cyclotron resonance technique, said dielectric layer is composed of silicon dioxide having a thickness in a range of between about 10,000 and 15,000 Å, said electro cyclotron resonance technique has an etch to deposit ratio in a range between about 30% and 35%, and said electro cyclotron resonance technique has an RF power in a range between about 1200 and 1600 watts and an argon flow rate in a range between about 80 and 100 sccm, and said closed void has a width in a range between about 0.1 and 0.2 µm and a length in a range between about 0.1 and 0.3 µm and a height from about 0.1 and 0.6 µm.

8. The method of claim 7 wherein the method further includes forming a SOG layer over said dielectric layer and etching back portions of said SOG layer.

9. The method of claim 7 which further includes planarizing said dielectric layer using a chemical mechanical polishing process.

10. The method of claim 7 wherein greater than one half of the volume of said void is located below the plane defined by said top surfaces of said metallurgy lines and above the substrate surface.

11. A method of forming voids in a low capacitance dielectric layer between narrowly spaced metallurgy lines on a substrate comprising:

forming narrowly spaced conductive metallurgy lines having top surfaces on a substrate surface, the spacing between said narrowly spaced metallurgy lines is in a range between about 0.45 and 0.55 µm and said narrowly spaced metallurgy lines have a width in a tinge between about 0.25 and 0.5 µm and a height in a range between about 0.4 and 0.6 µm, forming a dielectric layer having one closed void between adjacent metallurgy lines using an electro cyclotron resonance technique, said dielectric layer is composed of silicon dioxide having a thickness in a range of about 8000 and 30,000 Å, the electro cyclotron resonance technique has an etch to deposit ratio in a range between about 27% and 30%, and said electro cyclotron resonance technique has an RF power in a range between about 1200 and 1600 watts and an Argon flow rate in a range between about 70 and 90 sccm to achieve said etch to deposit ratio, and said closed void has a width in a range between about 0.1 and 0.2 µm and a length in a range between about 0.1 and 0.3 µm and a height from about 0.1 and 0.6 µm.

12. The method of claim 11 wherein the method further includes forming a SOG layer over said dielectric layer and etching back portions of said SOG layer.

13. The method of claim 11 which further includes planarizing said dielectric layer using a chemical mechanical polishing process.

14. The method of claim 11 wherein greater than one half of the volume of said void is located below the plane defined by said top surfaces of said metallurgy lines and above the substrate surface.

* * * * *